(12) United States Patent
Lee et al.

(10) Patent No.: US 8,216,938 B2
(45) Date of Patent: Jul. 10, 2012

(54) METHOD FOR FORMING SEMICONDUCTOR DEVICE

(75) Inventors: Ki Lyoung Lee, Hwaseong (KR); Jin Soo Kim, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 0 days.

(21) Appl. No.: 12/982,814

(22) Filed: Dec. 30, 2010

(65) Prior Publication Data

US 2012/0083126 A1  Apr. 5, 2012

(30) Foreign Application Priority Data

Oct. 5, 2010  (KR) .................. 10-2010-0096891

(51) Int. Cl.
*H01L 21/44* (2006.01)

(52) U.S. Cl. ................... 438/669; 257/E21.582

(58) Field of Classification Search ................ 438/668; 257/E21.582

See application file for complete search history.

(56) References Cited

U.S. PATENT DOCUMENTS

| 2004/0183101 | A1* | 9/2004 | Lee et al. ...................... 257/202 |
| 2008/1008146 | | 4/2008 | Lee et al. |
| 2008/0261395 | A1* | 10/2008 | Blawid et al. ................. 438/666 |
| 2009/0162795 | A1* | 6/2009 | Lee et al. ...................... 430/319 |
| 2009/0263749 | A1 | 10/2009 | Sim et al. |
| 2010/0112817 | A1* | 5/2010 | Lee .............................. 438/694 |
| 2011/0136350 | A1* | 6/2011 | Palli et al. ..................... 439/39 |
| 2011/0256723 | A1* | 10/2011 | Lee et al. ...................... 438/694 |
| 2011/0291182 | A1* | 12/2011 | Lee .............................. 257/329 |

FOREIGN PATENT DOCUMENTS

KR  1020090070535 A  7/2009

* cited by examiner

*Primary Examiner* — William D Coleman

(57) ABSTRACT

A method for forming a semiconductor device includes forming a partition line pattern and a partition pad pattern connected to an end part of the partition line pattern over the semiconductor substrate. Spacer insulation layers are formed at sidewalls of the partition line pattern and the partition pad pattern. A gap-filling layer is formed between the spacer insulation layers. A first cutting mask pattern is formed to expose a connecting part between the partition line pattern and the partition pad pattern. The partition line pattern and the gap-filling layer adjacent to the spacer insulation layer are removed using the first cutting mask pattern as a mask. A second cutting mask pattern including a first pattern and a second pattern are formed. The spacer insulation layer is removed using the second cutting mask pattern as a mask to form a gate trench in the substrate.

25 Claims, 12 Drawing Sheets

METHOD FOR FORMING SEMICONDUCTOR DEVICE

CROSS-REFERENCE TO RELATED APPLICATION

The priority of Korean patent application No. 10-2010-0096891 filed on 5 Oct. 2010, the disclosure of which is hereby incorporated in its entirety by reference, is claimed.

BACKGROUND OF THE INVENTION

Embodiments of the present invention relate to a method for forming a semiconductor device, and more particularly to a method for forming a semiconductor device using negative spacer patterning.

Today, most electronic appliances include a semiconductor device. The semiconductor device comprises electronic elements such as a transistor, a resistor and a capacitor. These electronic elements are designed to perform a partial function of the electronic device, and integrated on a semiconductor substrate. For example, electronic devices such as a computer and a digital camera include a memory chip for storing information and a processing chip for controlling information. The memory chip and the processing chip include electronic elements integrated on a semiconductor substrate.

There is a need to increase the integration degree of the semiconductor devices in order to satisfy consumer demands for superior performances and low prices. Such an increase in the integration degree entails a reduction in a design rule, causing patterns of a semiconductor device to be increasingly reduced. Although an entire chip area is increased in proportion to an increase in memory capacity, as a semiconductor device becomes super miniaturized and highly integrated, a unit cell area where patterns of a semiconductor device are actually formed is decreased. Accordingly, since a greater number of patterns need to be formed in a limited unit cell area in order to achieve a desired memory capacity, there is a need for formation of microscopic (fine) patterns having a reduced critical dimension scale.

However, an exposure device for implementing a fine pattern required for the increasing integration degree of a semiconductor device does not satisfy rapid development of associated technology. Specifically, a conventional exposure device for an exposure and development process onto a photo resist film has a limitation in resolution capability of the exposure device.

A representative method for forming such a fine pattern is a Double Patterning Technology (DPT). The DPT may be classified into a Double Expose Etch Technology (DE2T) and a Spacer Patterning Technology (SPT) that uses a spacer. The DE2T forms first patterns spaced by a first distance corresponding to a given critical dimension, and exposes a second pattern between the first patterns so that the first and the second patterns are spaced apart by half the given critical dimension.

The spacer pattering technology (SPT) may be classified into a positive spacer patterning technology and a negative patterning technology. 30 nm-level semiconductor devices have been generally patterned using the positive spacer patterning technology.

For example, a 40 nm-level device isolation film has been formed using a conventional single patterning method, and a 30 nm-class 6F2 device isolation film has been formed using the spacer patterning technology. However, when conventional positive spacer patterning is applied for a 20 nm-level 6F2 device isolation film to form an active region, a variety of problems are entailed, for example, collapse of a device isolation film, an insufficient active region, and a reduced patterning margin.

Therefore, the 20 nm-level 6F2 device isolation film must be formed in a line type instead of an island type, and cell isolation is made using a buried gate. In more detail, in addition to two buried gates serving as an active cell gate, two more buried gates are necessary for cell isolation.

When a line-type device isolation film is formed, the isolation buried gates need to be interconnected with each other, and a pad part connected needs to be formed at an end of a gate line used for operation. However, it is difficult for the above-mentioned requirements to be implemented in the conventional positive spacer patterning.

BRIEF SUMMARY OF THE INVENTION

Various embodiments of the present invention are directed to providing a method for forming a semiconductor device that substantially obviates one or more problems due to limitations and disadvantages of the related art.

An object of the present invention is to provide a method for forming a semiconductor device, which can solve the problems of the related art. According to the related art, when using a line-type device isolation film for implementation of a highly-integrated semiconductor device, it is difficult to implement a pattern requisite for a 6F2 structure using positive spacer patterning.

In accordance with an aspect of the present invention, a method for forming a semiconductor device includes forming a partition line pattern over a semiconductor substrate, and forming a partition pad pattern connected to an end part of the partition line pattern; forming spacer insulation layers at sidewalls of the partition line pattern and the partition pad pattern; forming a gap-filling layer between the spacer insulation layers; forming a first cutting mask pattern to expose a connection part between the partition line pattern and the partition pad pattern; removing the partition line pattern and the gap-filling layer adjacent to the spacer insulation layer using the first cutting mask pattern as a mask; forming a second cutting mask pattern including a first pattern and a second pattern, wherein the first pattern adjacent to a region exposed by the first cutting mask pattern and covers the gap-filling layer, the spacer insulation layer adjacent to the gap-filling layer, and some parts of the partition line pattern adjacent to the spacer insulation layer, and the second pattern covers the partition line pattern, the spacer insulation layer adjacent to the partition line pattern, and some parts of a gap-filling layer adjacent to the spacer insulation layer; and removing the spacer insulation layer using the second cutting mask pattern as a mask to form a gate trench in the substrate.

Before forming the partition line pattern and the partition pad pattern, the method may further include forming an insulation film over the semiconductor substrate.

In the forming of the partition line pattern and the partition pad pattern, an upper part of the insulation film may be partially etched so that an insulation pattern is formed.

The removing of the spacer insulation layer, and the partition line pattern and the gap-filling layer adjacent to the spacer insulation layer using the first cutting mask pattern as a mask does not remove the spacer insulation layer using the spacer insulation layer and an etch selection ratio between the partition line pattern and the gap-filling layer.

After forming the second cutting mask pattern, the method may further include forming an SOC film and a hard mask layer.

Each of the first pattern and the second pattern may be formed of an island pattern.

The method may further include, after removing the spacer insulation layer using the second cutting mask pattern as a mask, forming a trench by etching the semiconductor substrate using the residual partition line pattern, the partition pad pattern, and the gap-filling layer as a mask.

The trench may include a first trench of a line type, a second trench disposed in parallel to the first trench and spaced apart from the first trench, a third trench disposed in parallel to the first trench and the second trench and spaced apart from the first and the second trenches, and a fourth trench connected to the third trench and arranged in perpendicular to the third trench.

In accordance with another aspect of the present invention, a method for forming a semiconductor device includes forming a partition line pattern over a semiconductor substrate, and forming a partition pad pattern connected to an end part of the partition line pattern; forming one or more spacer insulation layers at sidewalls of the partition line pattern and the partition pad pattern; forming a gap-filling layer to be buried between the spacer insulation layers; forming a first cutting mask pattern including a first concave part and a second concave part, wherein the first concave part exposes a connecting part between the partition line pattern and the partition pad pattern and also exposes the spacer insulation layer and the gap-filling layer and the partition line pattern neighboring with the spacer insulation layer, and the wherein second concave part is spaced apart from the first concave part by the spacer insulation layer neighboring with the gap-filling layer; removing the partition line pattern and the gap-filling layer neighboring with the spacer insulation layer using the first cutting mask pattern as a mask; forming a second cutting mask pattern including a first pattern and a second pattern that cover some parts of a region exposed by the first concave and the second concave parts, wherein the first pattern and the second pattern are spaced apart from uneven parts of the first concave part and the second concave part; and removing the spacer insulation layer using the second cutting mask pattern as a mask.

Before forming the partition line pattern and the partition pad pattern, the method may further include forming an insulation film over the semiconductor substrate.

In the forming of the partition line pattern and the partition pad pattern, an upper part of the insulation film may be partially etched so that an insulation pattern is formed.

The removing of the spacer insulation layer, the partition line pattern and the gap-filling layer adjacent the spacer insulation layer using the first cutting mask pattern as a mask does not remove the spacer insulation layer using the spacer insulation layer and an etch selection ratio between the partition line pattern and the gap-filling layer.

The method may further include forming a trench by etching the semiconductor substrate using the residual partition line pattern, the partition pad pattern, and the gap-filling layer as a mask.

The trench may include a first trench of a line type; a second trench which is spaced apart from the first trench, is disposed in parallel to the first trench, and is shorter than the first trench; a third trench disposed in parallel to the first trench and the second trench and spaced apart from the first and second trenches; a fourth trench connected to an end part of the third trench and arranged in perpendicular to the third trench; and a pad part which is extended in a direction parallel to the fourth trench, is connected to an end part of the second trench, and is spaced apart from the first trench and the third trench.

In accordance with another aspect of the present invention, a method for forming a semiconductor device includes forming a partition line pattern over a semiconductor substrate, and forming a partition pad pattern connected to an end part of the partition line pattern; forming spacer insulation layers at sidewalls of the partition line pattern and the partition pad pattern; forming a gap-filling layer to be buried between the spacer insulation layers; forming a first cutting mask pattern including a first concave part and a second concave part, wherein the first concave part exposes a connecting part between the partition line pattern and the partition pad pattern and also exposes the spacer insulation layer on the basis of the gap-filling layer, and the second concave part is spaced apart from the first concave part by the partition line pattern and the gap-filling layer adjacent to the spacer insulation layer and exposes the spacer insulation layer adjacent to the partition line pattern; removing the partition line pattern and the gap-filling layer adjacent to the spacer insulation layer using the first cutting mask pattern as a mask; forming a second cutting mask pattern to include first and second patterns and third and fourth patterns, wherein the first and second patterns cover some parts of a region exposed by the first concave and second concave parts of the first cutting mask pattern, and the third and fourth patterns are connected to some parts of a region exposed by the first concave and second concave parts of the first cutting mask pattern and cover a partition pattern and a gap-filling layer formed at both sides of the spacer insulation layer; and removing the spacer insulation layer using the second cutting mask pattern as a mask.

Before forming the partition line pattern and the partition pad pattern, the method may further include forming an insulation film over the semiconductor substrate.

In the forming of the partition line pattern and the partition pad pattern, an upper part of the insulation film may be partially etched so that an insulation pattern is formed.

Each of the first pattern, the second pattern, the third pattern, and the fourth pattern may be formed of an island.

The removing of the spacer insulation layer, and the partition line pattern and the gap-filling layer adjacent to the spacer insulation layer using the first cutting mask pattern as a mask does not remove the spacer insulation layer using the spacer insulation layer and an etch selection ratio between the partition line pattern and the gap-filling layer.

The method may further include, after removing the spacer insulation layer using the second cutting mask pattern as a mask, forming a trench by etching the semiconductor substrate using the residual partition line pattern, the partition pad pattern, and the gap-filling layer as a mask.

The trench may include: a first trench of a line type; a second trench which is spaced apart from the first trench, is disposed in parallel to the first trench, and is longer than the first trench; a third trench disposed in parallel to the first trench and the second trench and spaced apart from the first and second trenches; a fourth trench connected to an end part of the third trench and arranged in perpendicular to the third trench; and a pad part which is extended in a direction parallel to the fourth trench, is connected to an end part of the second trench, and is spaced apart from the first trench and the third trench.

In accordance with another aspect of the present invention, a method for forming a semiconductor device includes forming a partition line pattern over a semiconductor substrate, and forming a partition pad pattern connected to an end part of the partition line pattern; forming one or more spacer insulation layers at sidewalls of the partition line pattern and the partition pad pattern; forming a gap-filling layer to be buried between the spacer insulation layers; forming a first cutting mask pattern including a first hole pattern and a second hole pattern, wherein the first hole pattern exposes a coupling part between the partition line pattern and the partition pad pattern and also exposes the spacer insulation layer on the basis of the gap-filling layer, and the second hole pattern is spaced apart from the first hole pattern by the partition line pattern and the gap-filling layer neighboring with the spacer insulation layer and exposes the spacer insulation layer neighboring with the partition line pattern; removing the partition line pattern and the gap-filling layer neighboring with the spacer insulation layer using the first cutting mask pattern as a mask; forming a second cutting mask pattern including a first pattern, a second pattern, a third pattern and a fourth pattern, wherein the first pattern is disposed between a region, that is exposed by removal of a coupling part between the partition line pattern and the partition pad pattern by the first cutting mask pattern, and a region exposed by the first hole pattern, and covers a gap-filling layer and a spacer insulation layer neighboring with the gap-filling layer; the second pattern is disposed between a region, that is exposed by removal of a coupling part between the partition line pattern and the partition pad pattern by the first cutting mask pattern, and a region exposed by the second hole pattern, and covers a partition line pattern and a spacer insulation layer neighboring with the partition line pattern; and the third and fourth patterns neighbor with the region exposed by the hole pattern and cover the spacer insulation layer and the partition line pattern and the gap-filling layer neighboring with the spacer insulation layer; and removing the spacer insulation layer using the second cutting mask pattern as a mask.

In accordance with another aspect of the present invention, a method for forming a semiconductor device includes providing a substrate including an active region and a device isolation region, forming a first mask pattern in a line type over the substrate at a boundary of the active region and the device isolation region, forming first and second spacer patterns at first and second sides of the first mask pattern, the first spacer pattern being located in the device isolation region, the second spacer pattern being located in the active region, the first spacer pattern and the second spacer pattern extending toward each other at a first end of the first mask pattern, forming a first pad pattern at the first end of the first mask pattern, and removing the first and the second spacer patterns to form a first gate trench in the device isolation region and a second gate trench in the active region, the first gate trench extending to the first pad pattern and the second gate trench isolated from the first pad pattern.

Forming the first pad pattern is performed using a second mask pattern exposing the first end of the first mask pattern.

Each of the first pattern, the second pattern, the third pattern, and the fourth pattern may be formed of an island.

Removing the first and the second spacer pattern is performed using a third mask pattern exposing the first spacer pattern and blocking the second spacer pattern.

The method may further include forming a second pad trench at an end of the second gate trench, the second pad trench extending from the second gate trench.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1:
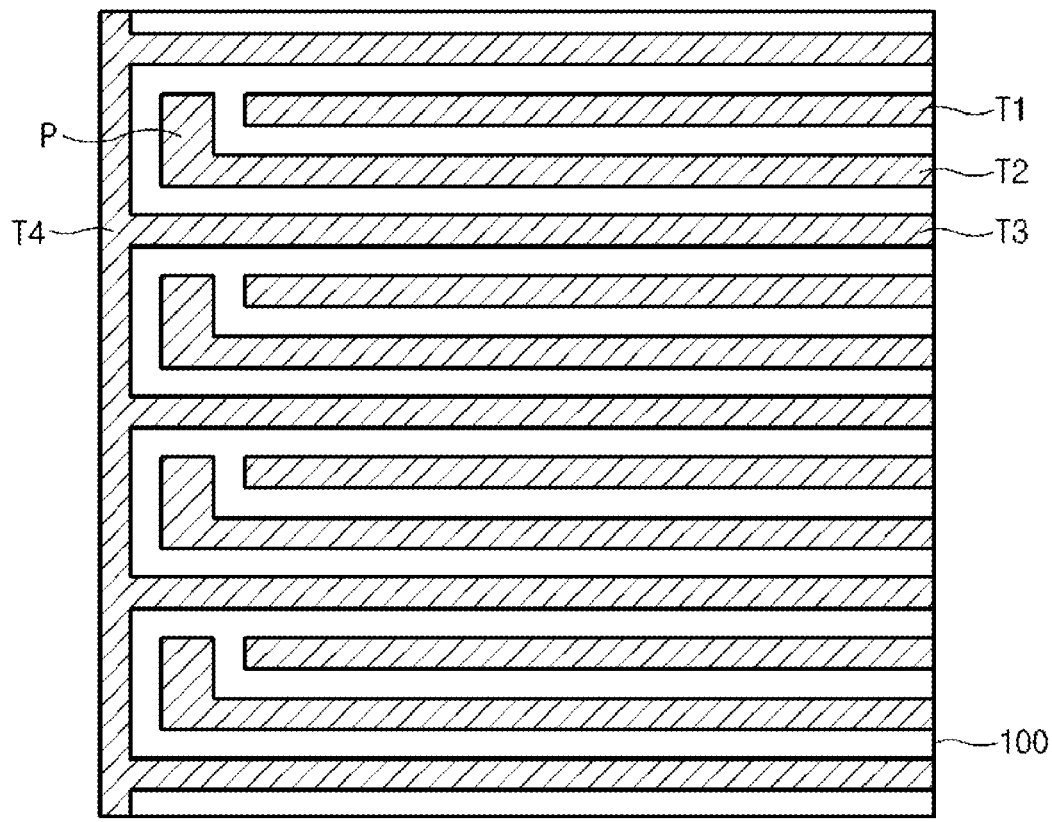
FIG. 1 is a plan view illustrating a semiconductor device according to an embodiment of the present invention.

FIG. 1 is a plan view illustrating a semiconductor device according to an embodiment of the present invention.

Referring to FIG. 1, a semiconductor device according to the present invention includes a first trench T1 formed in a semiconductor substrate; a second trench T2 neighboring the first trench T1, and including a pad part P having an end portion extended in the direction of the first trench T1; a third trench T3 which neighbors with the first trench T1 and the second trench T2; and a fourth trench T4 connected to the end of the third trench T3, and is located perpendicular to the third trench T3. It is preferable that the first trench T1 or the second trench T2 is a trench for an active cell gate, and the third trench T3 and the fourth trench T4 are trenches for an isolated gate.

A method for forming a semiconductor device having the above-mentioned device elements is as follows.

FIGS. 2A to 2J illustrate a method for forming a semiconductor device according to a first embodiment of the present invention. In each of FIGS. 2A to 2J, (i) is a plan view illustrating a method for forming a semiconductor device according to a first embodiment of the present invention, and (ii) is a cross-sectional view illustrating a semiconductor device taken along the line x-x' shown in (i).

Figure 2A:
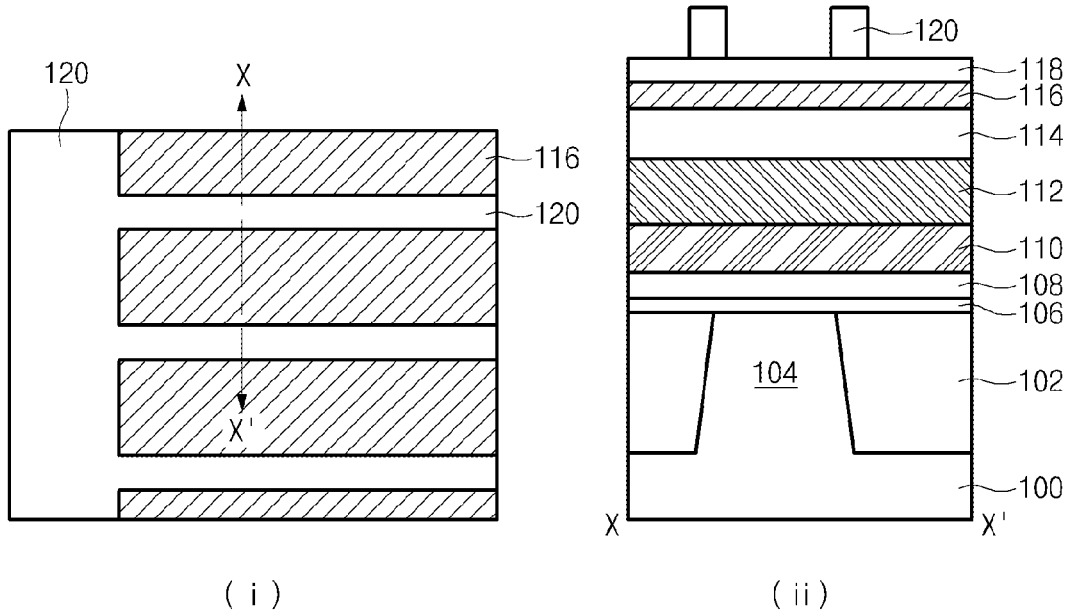
FIGS. 2A to 2J illustrate a method for forming a semiconductor device according to a first embodiment of the present invention. In each of FIGS. 2A to 2J, (i) is a plan view illustrating a method for forming a semiconductor device according to a first embodiment of the present invention, and (ii) is a cross-sectional view illustrating a semiconductor device taken along the line x-x' shown in (i).

Referring to FIG. 2A, a pad oxide film 106, a pad nitride film 108, an insulation film 110, a partition layer 112, a hard mask layer 114, and a silicon oxide nitride film 116 are sequentially formed on a semiconductor substrate 100 including an active region 104 defined by a device isolation film 102. The insulation film 110 may include Plasma Enhanced Tetra Ethyl Ortho Silicate (PETEOS), and the partition layer 112 may include poly silicon. In addition, the hard mask layer 114 includes an amorphous carbon layer. In this case, it is difficult to pattern the partition layer 112 using a general photo resist pattern. Thus, the hard mask layer 114 and the silicon oxide nitride film 116 are formed so that the resultant structure is used as a hard mask for patterning the partition layer 112.

Subsequently, a reflection prevention film 118 and a photo resist pattern 120 are sequentially formed. The pitch of the photo resist pattern 120 may be double that of a finally-formed buried gate pitch. As can be seen from FIG. 2A(i), one side of the photo resist pattern 120 may be formed in a line pattern and the other side thereof may be formed in a pad pattern for interconnection of individual line patterns.

Figure 2B:
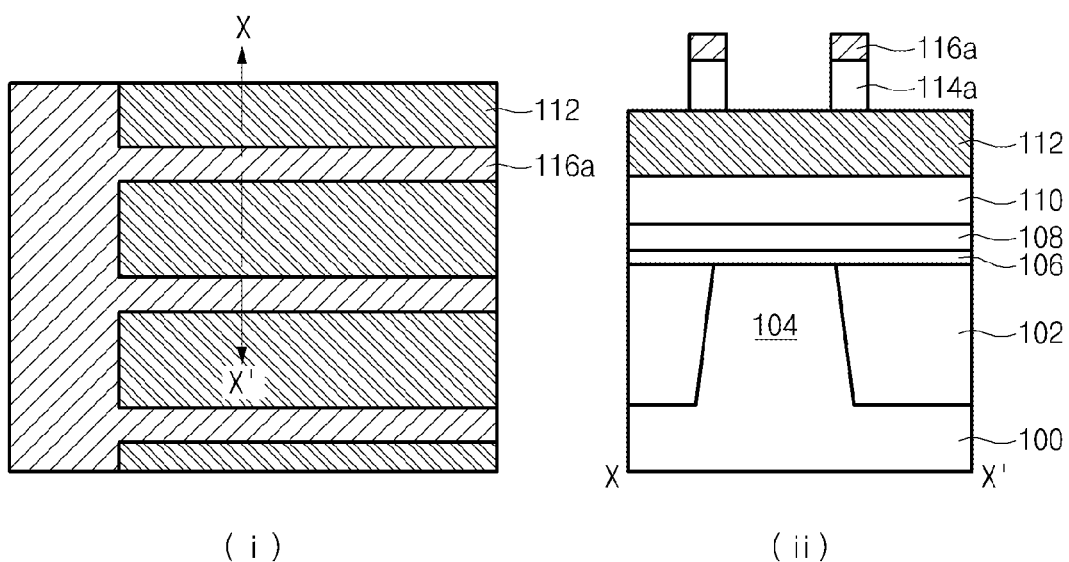

Referring to FIG. 2B, the reflection prevention film 118 and the silicon oxide nitride film 116 are etched using the photo resist pattern 120 as a mask so as to expose the partition layer 112, so that a silicon oxide nitride pattern 116a is formed. Subsequently, the hard mask layer 114 is etched using the silicon oxide nitride pattern 116a as a mask, so that a hard mask pattern 114a is formed.

Figure 2C:
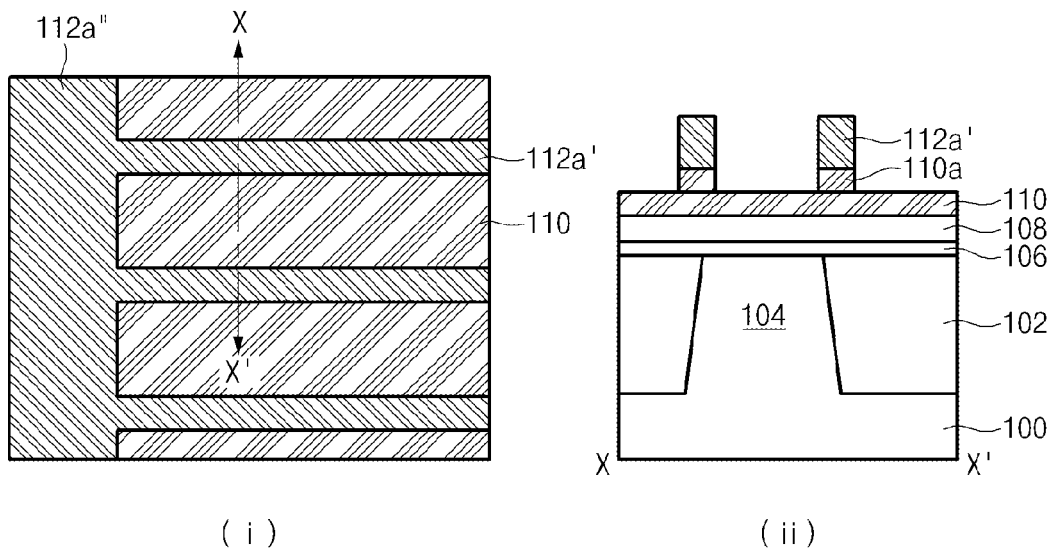

Referring to FIG. 2C, the partition layer 112 is etched using the silicon oxide nitride pattern 116a and the hard mask pattern 114a as a mask so as to expose the insulation film 110. This etching forms a partition pattern 112a. In this case, the partition pattern 112a includes a line part and a pad part. For convenience of description and better understanding of the present invention, the line part will hereinafter be referred to as a line pattern 112a', and the pad part will hereinafter be referred to as a partition pad pattern 112a".

Subsequently, some parts of the insulation film 110 may be etched using the partition pattern 112a as a mask so as to form the insulation pattern 110a. In this case, the reason why the insulation pattern 110a is formed will hereinafter be described with reference to FIG. 2J.

Figure 2D:
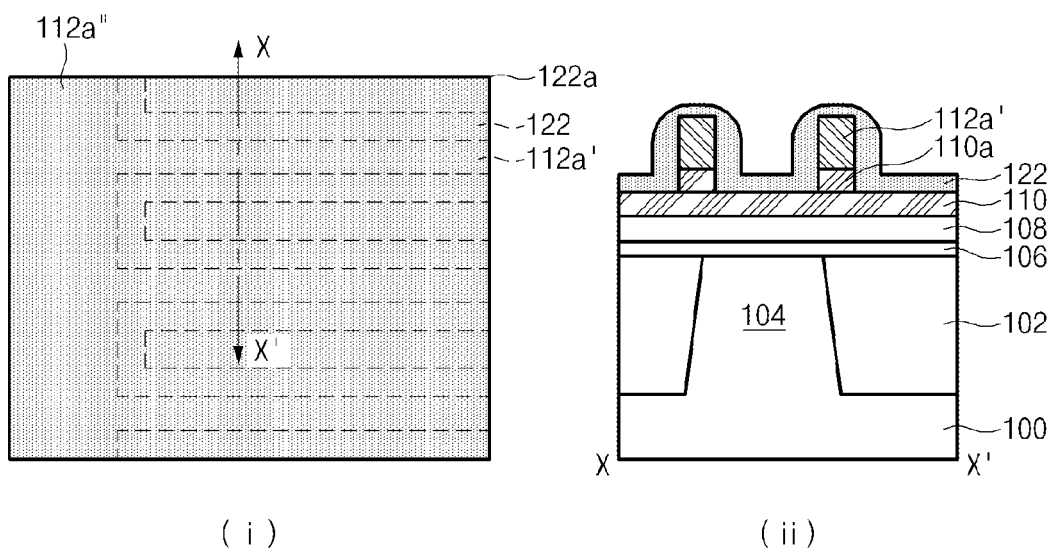

Referring to FIG. 2D, the spacer insulation layer 122 may be formed over the insulation film 110, the insulation pattern 110a, and the partition pattern 112a. The spacer insulation film 122 may include an oxide film. The thickness of the spacer insulation layer 122 may affect the critical dimension of a buried gate to be formed in a subsequence process, so that the spacer insulation layer 122 is formed of material with a superior step coverage characteristic. In addition, the spacer insulation layer 122 may be formed by an Atomic Layer Deposition (ALD) method.

Figure 2E:
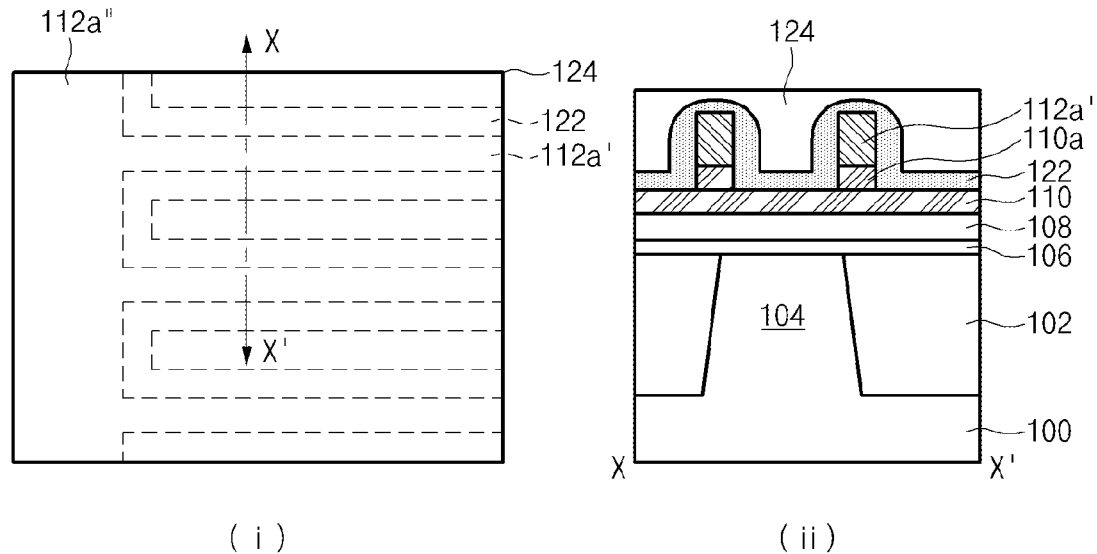

Referring to FIG. 2E, a gap-filling layer 124 is formed between the spacer insulation layers 122. The gap-filling layer 124 may be formed of the same material as that of the partition layer 112.

Figure 2F:
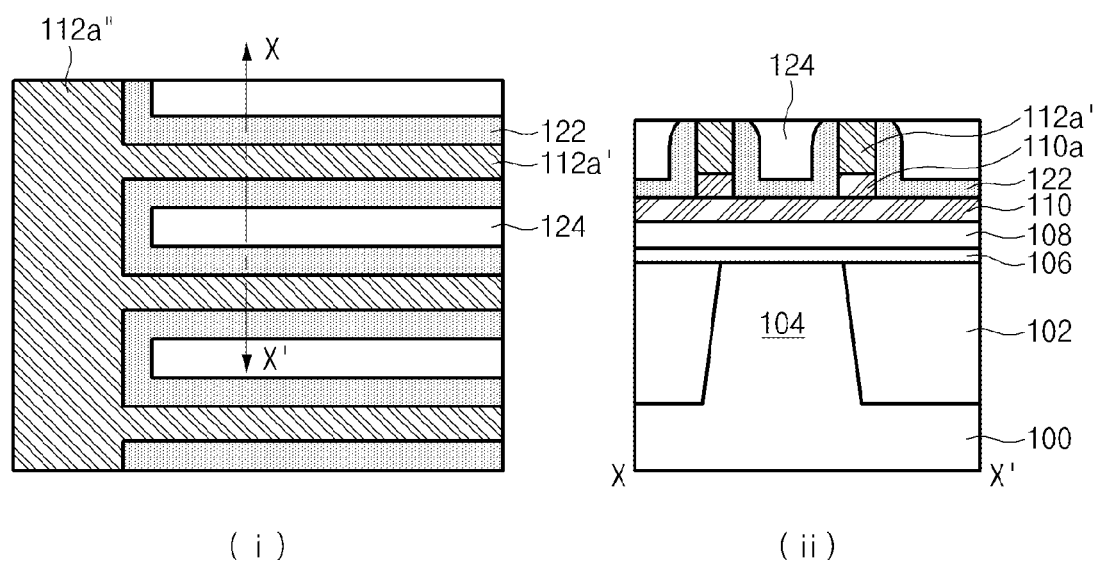

Referring to FIG. 2F, an etch-back process is performed on the gap-filling layer 124 so that planarization of the gap-filling layer is achieved. The etch-back process may be a dry etch-back process. Besides the etch-back process, a planarization etch process or a wet strip process may also be used. Subsequently, the spacer insulation layer 122 is etched back to expose the partition pattern 112a.

Figure 2G:
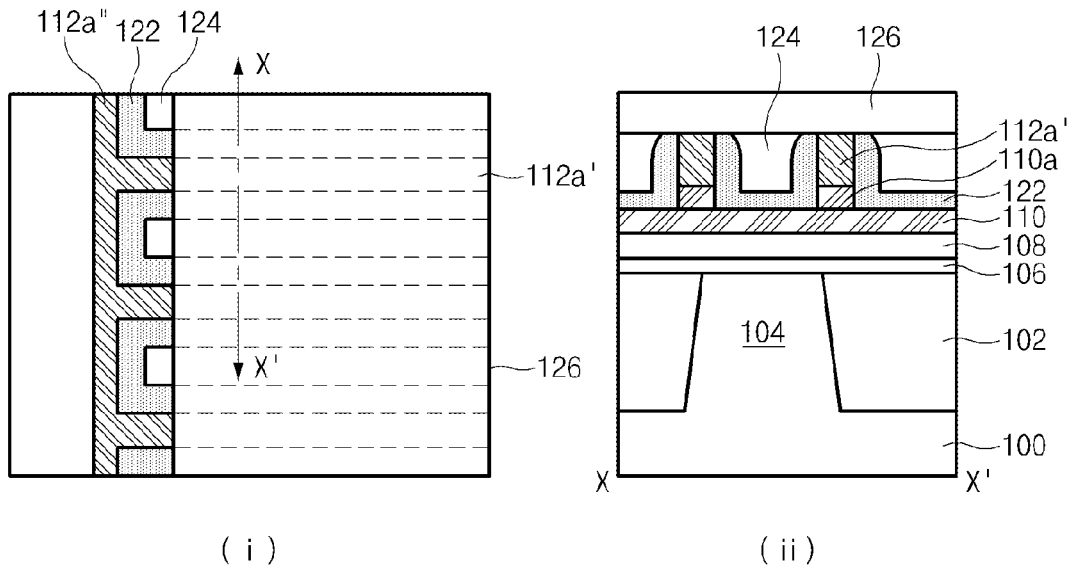

Referring to FIG. 2G, a first cutting mask pattern 126 is formed over the partition pattern 112a, the spacer insulation layer 122, and the gap-filling layer 124. The first cutting mask pattern 126 may be a mask connected to one side of a trench (T$_I$) (See FIG. 2J) of the isolation gate, and may be formed to expose a connecting part between the partition line pattern 112a' and the partition pad pattern 112a". The region exposed to the first cutting mask pattern 126 may be formed in a line pattern. More specifically, the first cutting mask pattern 126 may expose the spacer insulation layer 122 enclosing the end of the gap-filling layer 124 in a 'U'-letter shape.

Figure 2H:
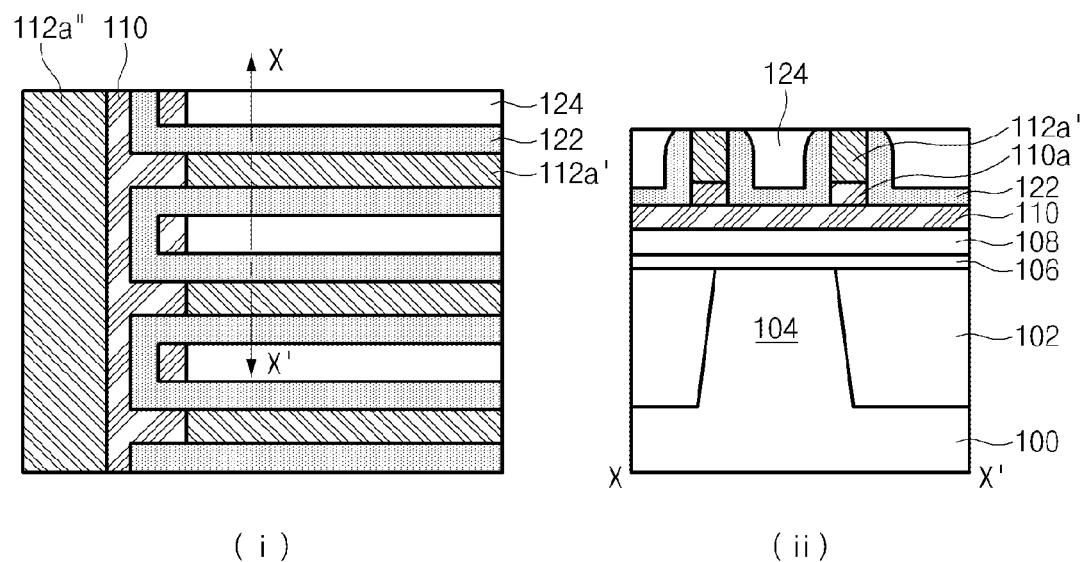

Referring to FIG. 2H, the partition pattern 112a and the gap-filling layer 124 are removed in such a manner that the insulation film 110 is exposed using the first cutting mask pattern 126 as a mask. In this case, the partition pattern 112a or the gap-filling layer 124 has an etch selection ratio different from that of the spacer insulation layer 122, so that the spacer insulation 122 is not removed while the partition pattern 112a and the gap-filling layer 124 are removed using the first cutting mask pattern 125 as a mask. The partition pattern 112a and the gap-filling layer 124 may be dry-etched. After that, the first cutting mask pattern 125 is removed by stripping.

Figure 2I:
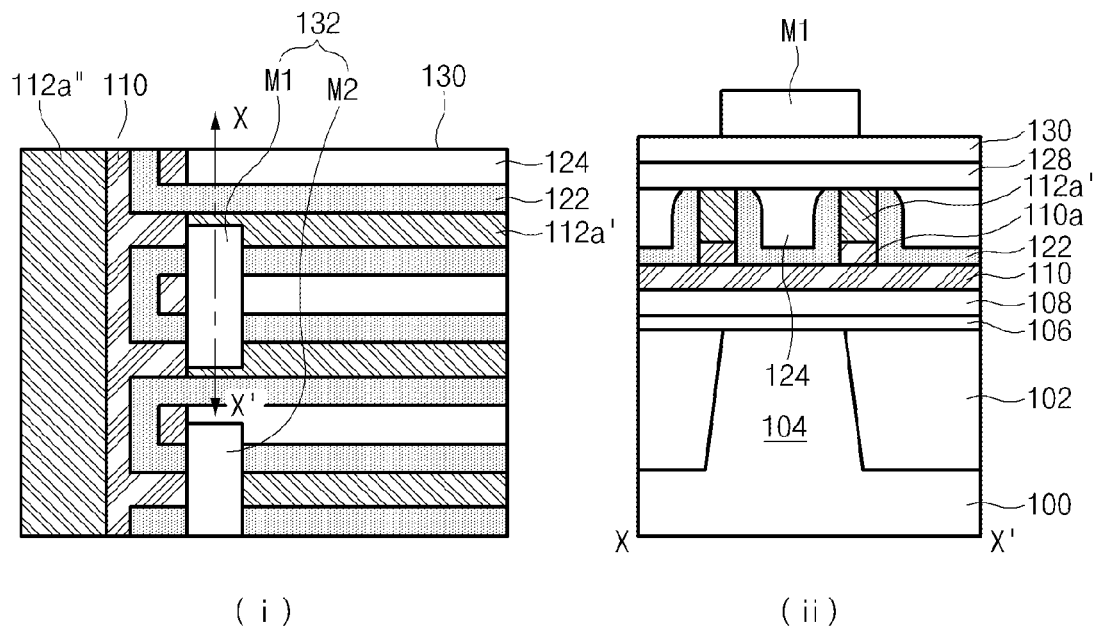

Referring to FIG. 2I, an SOC film 128 and a hard mask layer 130 are formed over the insulation film 110, the partition pattern 112a, the spacer insulation layer 122 and the gap-filling layer 124. In this case, the SOC film 128 is subject to planarization to overcome a difference in height (i.e., a step height) caused when the insulation film 110 is exposed by a patterning process employing the first cutting mask pattern 126. In addition, the hard mask layer 130 may include an Anti Reflect Coating (Si-ARC) or Bottom Anti Reflective Coating (BARC).

Subsequently, a second cutting mask pattern 132 is formed. The second cutting mask pattern 132 includes a first island-shaped pattern M1 and a second island-shaped pattern M2. The first pattern M1 neighbors with a region exposed by the first cutting mask pattern 126, and covers a gap-filling layer 124, a spacer insulation layer 122 formed at both sides of the gap-filling layer 124, and some parts of the partition line pattern 112a' neighboring with the spacer insulation layer 122. The second pattern M2 covers the partition line pattern 112a', the spacer insulation layer 122 formed at both sides of the partition line pattern 112a', and some parts of the gap-filling layer 124 neighboring with the spacer insulation layer 122.

In this case, the second cutting mask pattern 132 is formed to isolate trenches (T$_A$, See FIG. 2J) for actual cell gates. Accordingly, the gap-filling layer 124 and the spacer insulation layer 122 may remain unetched when the hard mask layer 130 and the SOC film 128 are etched using the second cutting mask pattern 132 as an etch mask.

Figure 2J:
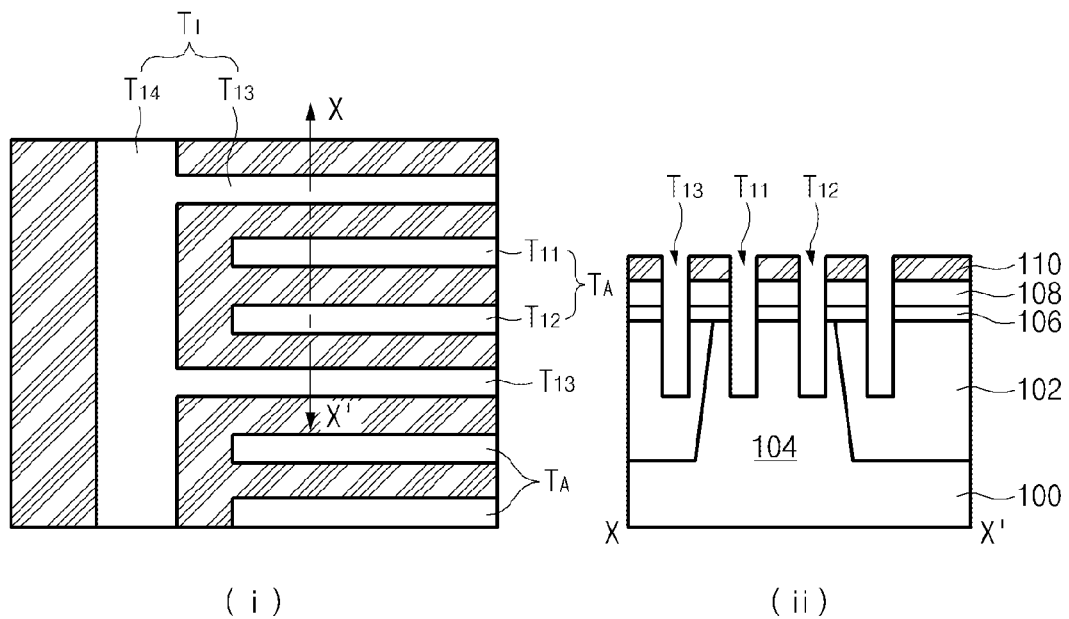

Referring to FIG. 2J, the hard mask layer 130 and the SOC film 128 may be etched using the second cutting mask pattern 132 as a mask. Subsequently, the spacer insulation layer 122 is removed using an etch selection ratio between the partition pattern 112a and the spacer insulation layer 122 (this method refers to a negative spacer pattering method). During the above-mentioned process, the spacer insulation film 122 remains under the gap-filling layer 124. The spacer insulation layer 122 along with the insulation pattern 110a shown in FIG. 2C may be used as a mask for etching the insulation film 110 in a subsequent process. That is, by the formation of the insulation pattern 110a, the insulation film 110 is etched using the partition pattern 112a as a mask may be adjusted to be identical to another condition where the insulation film 110 is etched using the gap-filling layer 124 as a mask. Such adjustment for achieving the same etching condition may solve problems encountered when the final buried gate trench is formed by etching the insulation film 110. A description of the problems is as follows. Under the condition that the final buried gate trench is formed by etching the insulation film 110, if an etching condition is changed according to categories of an etching mask used to etch the insulation film 110, an etch selection ratio is changed, and thus an etching profile is also changed, such that it is difficult to form the resultant buried gate trench of the same width. However, the above-mentioned adjustment for achieving the same etching condition can solve the aforementioned problems. In other words, since Space Patterning Technology (SPT) using a spacer as an etch-subject layer is employed, the etch target such as the insulating film 110 can be uniformly etched both in width and in profile. As a result, trenches formed in a subsequent process also can have uniform profiles.

Subsequently, the insulation film 110, the pad nitride film 108, and the pad oxide film 106 are etched using the partition pattern 112a, the insulation pattern 110a, the gap-filling layer 124, and the spacer insulation layer 122 as a mask, and the device isolation film 102 and the active region 104 are etched, resulting in formation of trenches $T_A$ and $T_I$ in the active region 104 and the device isolation film 102, respectively.

The trench $T_A$ may include a first trench T11 and a second trench T12 which is parallel to the first trench T11 and spaced apart from the first trench T11. The trench $T_I$ may include a third trench T13 and a fourth trench T14. The third trench T13 is parallel to the first trench T11 and the second trench T12, and is spaced apart from the first trench T11 and the second trench T12. The fourth trench T14 is connected to an end of the third trench T13, and is arranged perpendicular to the third trench T13.

In this case, as shown in FIG. 2J(i), the trench ($T_A$) represents a trench for a gate used for cell operation, and the trench ($T_I$) represents a trench for an isolation buried gate. Thereafter, the partition pattern 112a, the insulation pattern 110a, the gap-filling layer 124 and the spacer insulation layer 122 are removed.

Second to fourth embodiments of the present invention will disclose a method for forming a contact part connected to a bit line at the end of a gate used for cell operation. Prior to describing the second to fourth embodiments, the second to fourth embodiments have the same processes up to the step where the gap-filling layer 124 is planarized to expose the partition pattern 112a, and as such a detailed description of FIGS. 2A to 2F will be omitted from the second to fourth embodiments for convenience of description.

FIGS. 3A to 3D illustrate a method for forming a semiconductor device according to a second embodiment of the present invention. In each of FIGS. 3A to 3D, (i) is a plan view illustrating a method for forming a semiconductor device according to a second embodiment of the present invention, and (ii) is a cross-sectional view illustrating a semiconductor device taken along the line x-x' according to a second embodiment of the present invention.

Figure 3A:
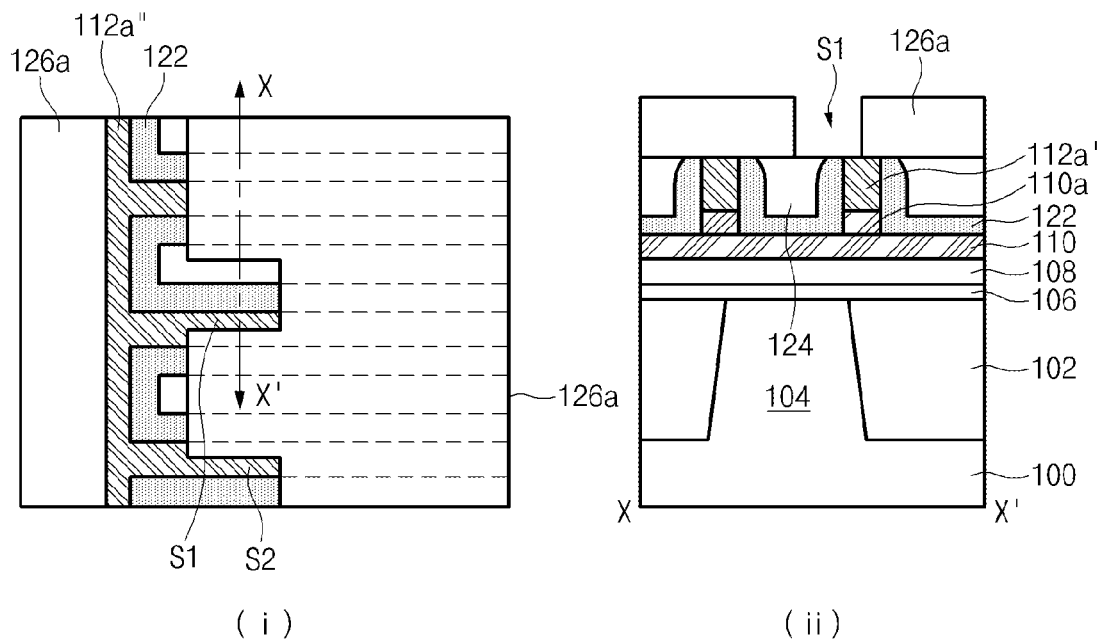
FIGS. 3A to 3D illustrate a method for forming a semiconductor device according to a second embodiment of the present invention. In each of FIGS. 3A to 3D, (i) is a plan view illustrating a method for forming a semiconductor device according to a second embodiment of the present invention, and (ii) is a cross-sectional view illustrating a semiconductor device taken along the line x-x' shown in (i).

Referring to FIG. 3A, a first cutting mask pattern 126a is formed over the partition pattern 112a, the spacer insulation layer 122 and the gap-filling layer 124. The first cutting mask pattern 126a is formed to expose a connecting part between the partition line pattern 112a' and the partition pad pattern 112a". The first cutting mask pattern 126a includes an uneven part. The uneven part includes a first concave part S1 and a second concave part S2. The first concave part S1 exposes a gap-filling layer 124 and a partition line pattern 112a' which are adjacent to each other with respect to the spacer insulation layer 122. The second concave part S2 is spaced apart from the first concave part S1 on the basis of the spacer insulation layer 122 neighboring with the gap-filling layer 124.

Figure 3B:
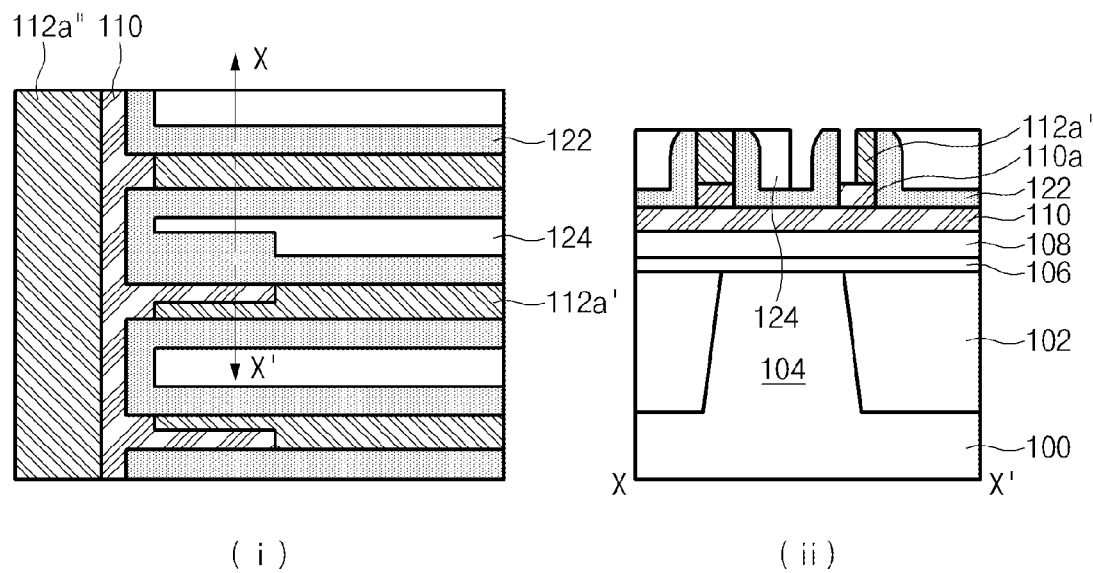
Figure 3C:
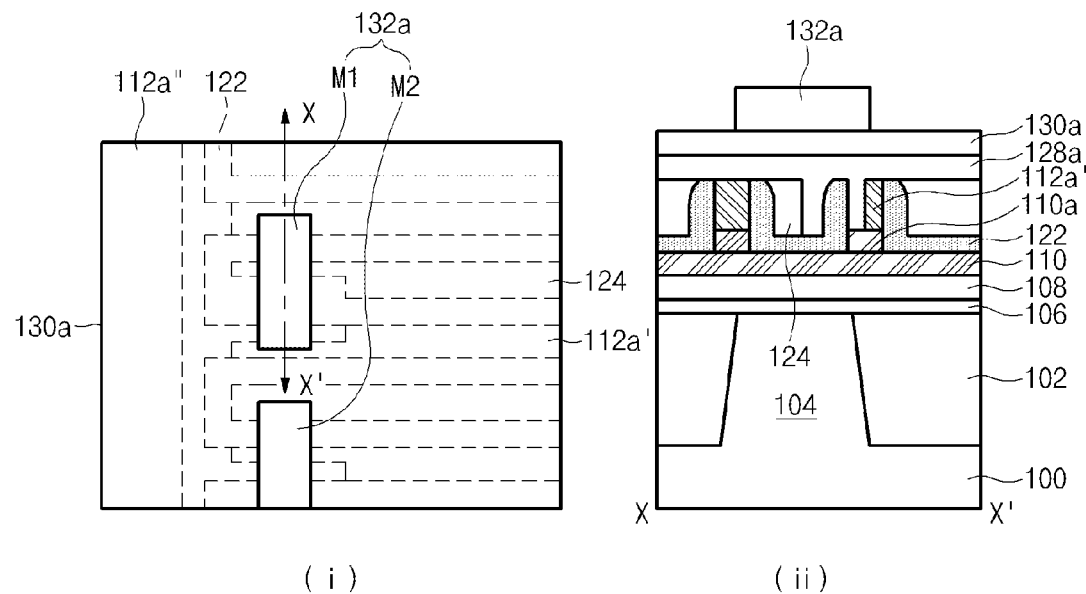
Figure 3D:
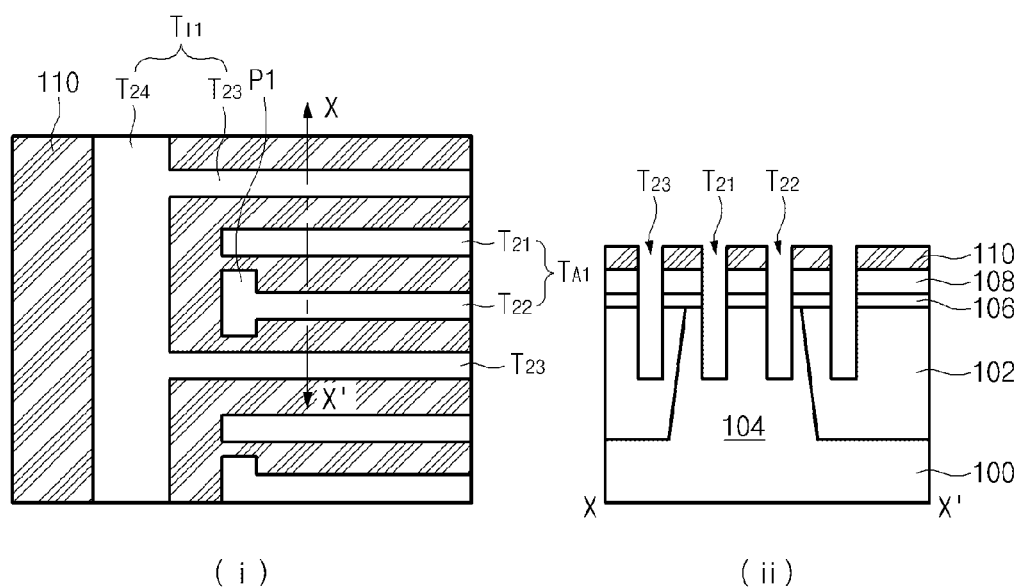

The first cutting mask pattern 126a is used as a mask connected to one side of an isolation gate trench ($T_{I1}$, See FIG. 3D). The first concave part S1 and the second concave part S2 may define not only a second cutting mask pattern 132a (See FIG. 3C) to be formed in a subsequent process, but also a pad part P1 (See FIG. 3D) of a trench for an active cell gate.

Referring to FIG. 3B, the partition pattern 112a and the gap-filling layer 124 are removed using the first cutting mask pattern 126a as a mask. In this case, the partition pattern 112a or the gap-filling layer 124 may have an etch selection ratio different from that of the spacer insulation layer 122, so that the spacer insulation layer 122 is not removed when the partition pattern 112a and the gap-filling layer 124 are removed using the first cutting mask pattern 126a as a mask. The partition pattern 112a and the gap-filling layer 124 may be dry-etched. After that, the first cutting mask pattern 126a is removed by stripping.

Referring to FIG. 3C, an SOC film 128a and a hard mask layer 130a are formed on the insulation film 110, the partition pattern 112a, the spacer insulation layer 122 and the gap-filling layer 124. Subsequently, a second cutting mask pattern 132a is formed and includes a first island-shaped pattern M1 and a second island-shaped pattern M2 that cover some parts of a region exposed by the first concave part S1 and the second concave part S2 of the first cutting mask pattern 126a. The first pattern M1 and the second pattern M2 may be spaced apart from uneven parts of the first concave part S1 and the second concave part S2.

In this case, the second cutting mask pattern 132a may be adapted to define an end of a trench ($T_{A1}$, See FIG. 3D) for the actual cell gate. When the hard mask layer 130a and the SOC film 128a are etched using the second cutting mask pattern 132a as an etch mask, the spacer insulation layer 122 is also removed so that a pad part P1 (See FIG. 3D) is defined.

Referring to FIG. 3D, the hard mask layer 130a and the SOC film 128a may be etched using the second cutting mask pattern 132a as a mask. Subsequently, the spacer insulation layer 122 is removed using an etch selection ratio between the partition pattern 112a and the spacer insulation layer 122. After that, the insulation film 110, the pad nitride film 108, and the pad oxide layer 106 are etched using the partition pattern 112a, the insulation pattern 110a, the gap-filling layer 124 and the spacer insulation layer 122, and then the device isolation film 102 and the active region are etched so that trenches $T_{A1}$ and $T_{I1}$ and the pad part P1 are formed.

The trench $T_{A1}$ may include a first trench T21 of a line type and a second trench T22 disposed in parallel to the first trench T21. The second trench T22 is disposed simultaneously with the first trench T21 while being spaced apart from the first trench T21. The second trench T22 may be shorter than the first trench T21. The trench $T_{I1}$ may include a third trench T23 and a fourth trench T24. The third trench T23 is formed parallel to the first trench T21 and the second trench T22, and is spaced apart from the first and second trenches T21 and T22. The fourth trench T24 is connected to an end of the third trench T23, and is formed perpendicular to the third trench T23.

The pad part P1 may be connected to an end of the second trench T22 and may be extended parallel to the fourth trench T24. The pad part P1 may also be spaced apart from the first trench T21 and the third trench T23. Thereafter, the partition pattern 112a, the insulation pattern 110a, the gap-filling layer 124 and the spacer insulation layer 122 are removed.

As described above, the second embodiment of the present invention discloses a method for forming a pad part contained on one side of the gate and capable of operating a cell region. Hereinafter, a method for forming a modified shape of the pad part shown in the second embodiment will be described with reference to the third and fourth embodiments of the present invention.

FIGS. 4A to 4D illustrate a method for forming a semiconductor device according to a third embodiment of the present invention. In each of FIGS. 4A to 4D, (i) is a plan view illustrating a method for forming a semiconductor device according to a third embodiment of the present invention, and (ii) is a cross-sectional view illustrating a semiconductor device taken along the line x-x' shown in (i).

Figure 4A:
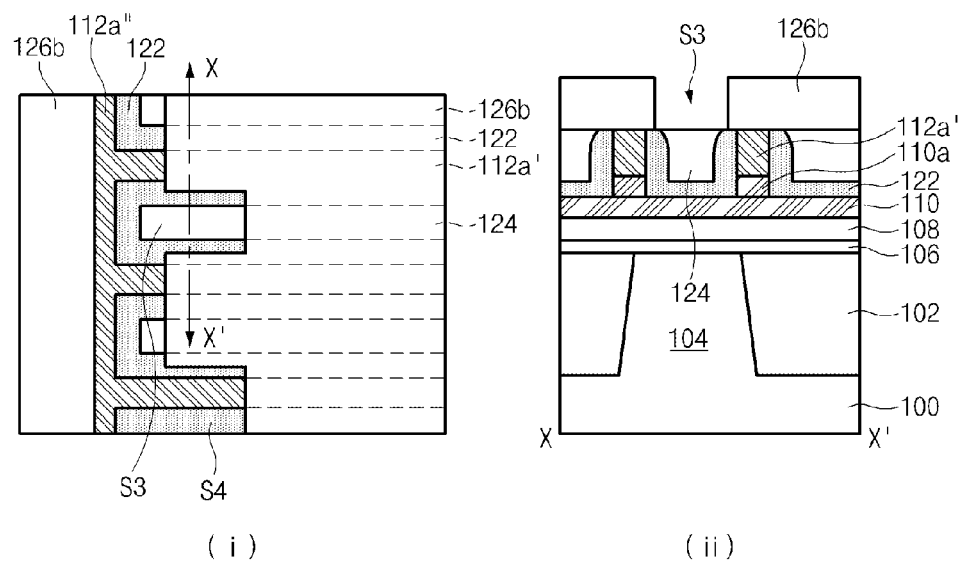
FIGS. 4A to 4D illustrate a method for forming a semiconductor device according to a third embodiment of the present invention. In each of FIGS. 4A to 4D, (i) is a plan view illustrating a method for forming a semiconductor device according to a third embodiment of the present invention, and (ii) is a cross-sectional view illustrating a semiconductor device taken along the line x-x' shown in (i).

Referring to FIG. 4A, the first cutting mask pattern 126b is formed over the partition pattern 112a, the spacer insulation layer 122, and the gap-filling layer 124. The first cutting mask pattern 126b may be formed to expose a connecting part between the partition line pattern 112a' and the partition pad pattern 112a". The first cutting mask pattern 126b may also include an uneven part. The uneven part includes a first concave part S3 and a second concave part S4. The first concave part S3 exposes the spacer insulation layer 122 on the basis of the gap-filling layer 124. The second concave part S4 is spaced apart from the partition line pattern 112a by the gap-filling layer 124 neighboring with the spacer insulation layer 122, and exposes the spacer insulation layer 122 on the basis of the partition line pattern 112a'.

Figure 4B:
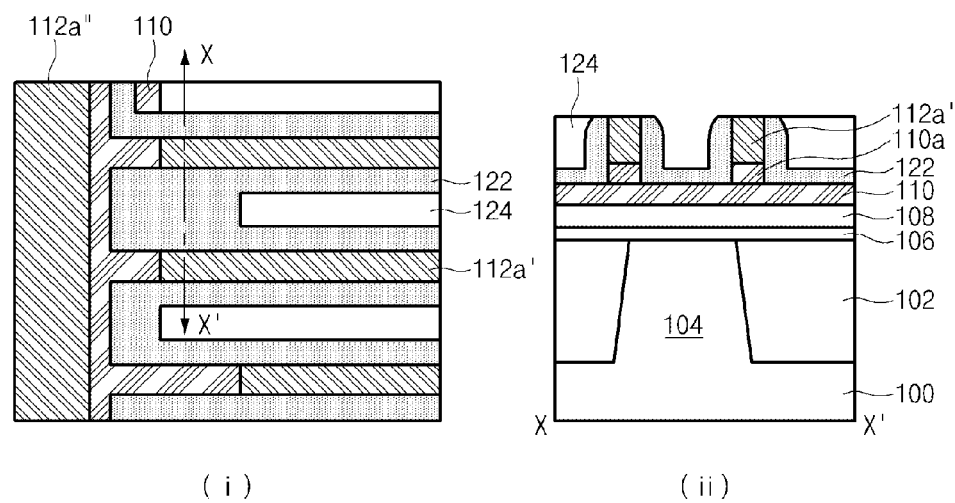
Figure 4C:
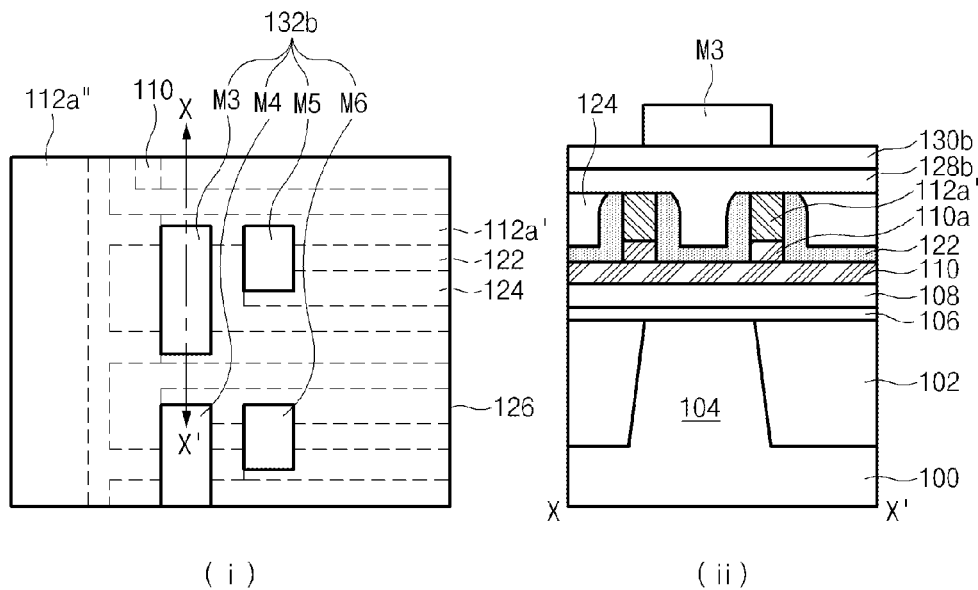
Figure 4D:
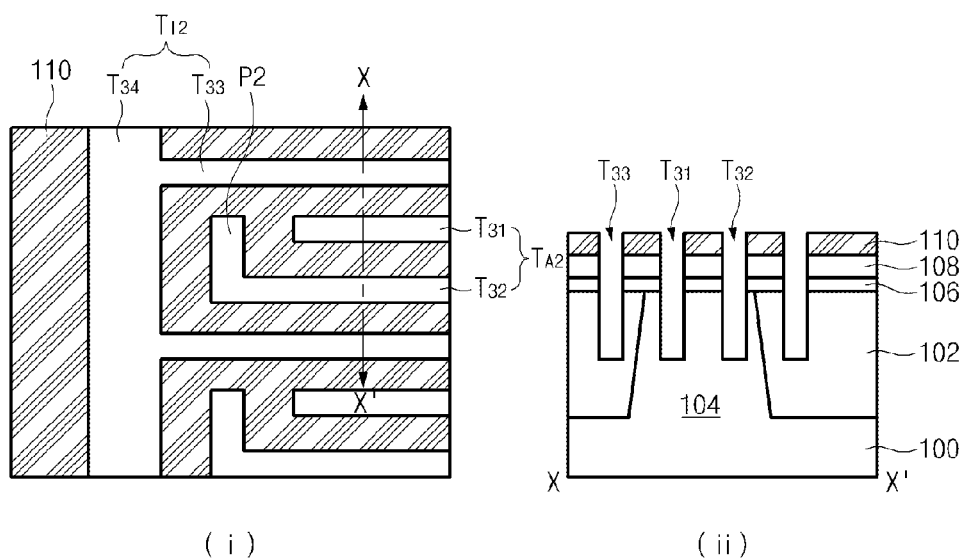

The first cutting mask pattern 126b is used as a mask connected to one side of the isolation gate trench ($T_{f2}$, See FIG. 4D). The first concave part S3 and the second concave part S4 may define a second cutting mask pattern 132b (See FIG. 4C) to be formed in a subsequent process and a pad part P2 (See FIG. 4D) of a trench of a gate used for cell operation.

Referring to FIG. 4B, the partition pattern 112a and the gap-filling layer 124 are removed using the first cutting mask pattern 126b as a mask. In this case, the partition pattern 112a or the gap-filling layer 124 has an etch selection ratio different from that of the spacer insulation layer 122. This allows the spacer insulation layer 122 to remain while the partition pattern 112a and the gap-filling layer 124 are removed using the first cutting mask pattern 126b as a mask. The partition pattern 112a and the gap-filling layer 124 may be dry-etched. Thereafter, the first cutting mask pattern 126b may be removed by stripping.

Referring to FIG. 4C, an SOC film 128b and a hard mask layer 130b are formed on the insulation film 110, the partition pattern 112a, the spacer insulation layer 122 and the gap-filling layer 124. Subsequently, a second cutting mask pattern 132b includes not only first and second patterns M3 and M4 that cover some parts of a region exposed by the first concave and second concave parts S3 and S4 of the second cutting mask pattern 132b, but also third and fourth patterns M5 and M6. The third and fourth patterns M5 and M6 are connected to a region exposed by the first concave and second concave parts S3 and S4 of the second cutting mask pattern 132b, and cover the gap filling layer 124 and the partition pattern 112a disposed at both sides of the spacer insulation layer 122. In this case, the first pattern M3, the second pattern M4, the third pattern M5, and the fourth pattern M6 may be formed as an island pattern.

In this case, the third pattern M5 and the fourth pattern M6 may define one end of a trench ($T_{A2}$, See FIG. 4D) for an actual cell gate, the first pattern M3 and the third pattern M5 may define the pad part P2 (See FIG. 4D), and the second pattern M4 and the fourth pattern M6 may also define the pad part P2 (See FIG. 4D).

Referring to FIG. 4D, the hard mask layer 130b and the SOC film 128b are etched using the second cutting mask pattern 132b as a mask. Subsequently, the spacer insulation layer 122 is removed using an etch selection ratio between the partition pattern 112a and the spacer insulation layer 122. Subsequently, after the insulation film 110, the pad nitride film 108, and the pad oxide film 106 are etched using the partition pattern 112a, the insulation pattern 110a, the gap-filling layer 124, and the spacer insulation layer 122 as a mask, the device isolation film 102 and the active region 104 are etched, so that the trenches $T_{A2}$ and $T_{f2}$ and the pad part P2 are formed.

The trench $T_{A2}$ may include a first trench T31 of a line type and a second trench T32 disposed in parallel to the first trench T31 simultaneously while being spaced apart from the first trench T31. The second trench T32 may be longer than the first trench T31. In addition, the trench $T_{f2}$ may include a third trench T33 and a fourth trench T34. The third trench T33 is disposed parallel to the first and second trenches T31 and T32 and is spaced apart from the first and second trenches T31 and T32. The fourth trench T34 is connected to the end of the third trench T33, and is located perpendicular to the third trench T33.

The pad part P2 may be connected to one side of the second trench T32 and may be extended in the direction of the first trench T31 parallel to the fourth trench T34. The pad part P2 may also be spaced apart from the third trench T33. After that, the partition pattern 112a, the insulation pattern 110a, the gap-filling layer 124, and the space insulation layer 122 are removed.

The above-mentioned pad P2 may also be formed in another method, and a detailed description thereof will hereinafter be described with reference to FIGS. 5A to 5D.

FIGS. 5A to 5D illustrate a method for forming a semiconductor device according to a fourth embodiment of the present invention. In each of FIGS. 5A to 5D, (i) is a plan view illustrating a method for forming a semiconductor device according to a fourth embodiment of the present invention, and (ii) is a cross-sectional view illustrating a semiconductor device taken along the line x-x' shown in (i).

Figure 5A:
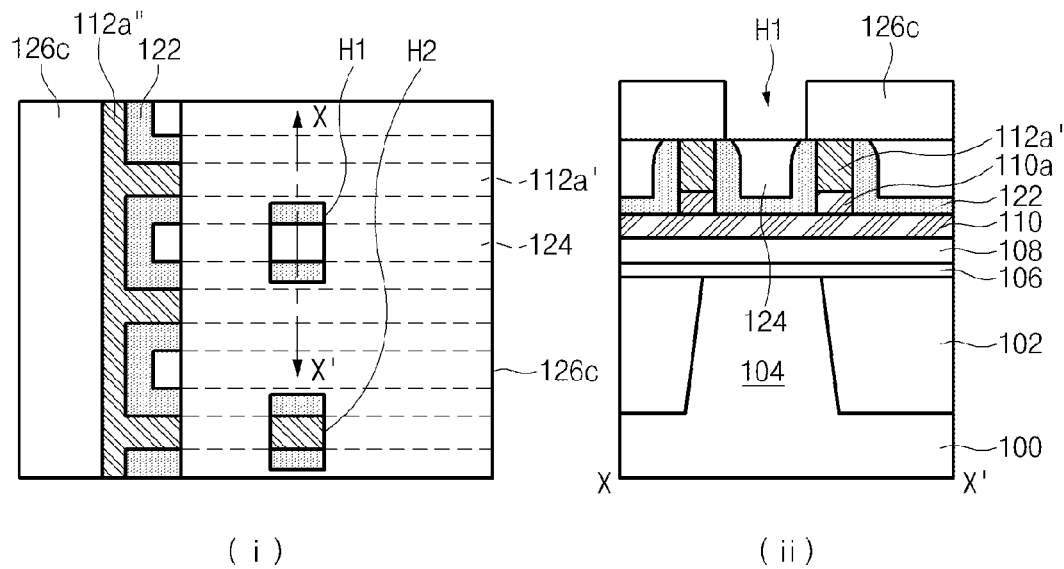
FIGS. 5A to 5D illustrate a method for forming a semiconductor device according to a fourth embodiment of the present invention. In each of FIGS. 5A to 5D, (i) is a plan view illustrating a method for forming a semiconductor device according to a fourth embodiment of the present invention, and (ii) is a cross-sectional view illustrating a semiconductor device taken along the line x-x' shown in (i).

Referring to FIG. 5A, the first cutting mask pattern 126c is formed over the partition pattern 112a, the spacer insulation layer 122, and the gap-filling layer 124. The first cutting mask pattern 126c may be formed to expose a connecting part between the partition line pattern 112a' and the partition pad pattern 112a". The first cutting mask pattern 126c may also include a hole pattern. The hole pattern includes a first hole pattern H1 and a second hole pattern H2. The first hole pattern H1 exposes the spacer insulation layer 122 with respect to the gap-filling layer 124. The second hole pattern H2 is spaced apart from the partition line pattern 112a by the gap-filling layer 124 neighboring with the spacer insulation layer 122, and exposes the spacer insulation layer 122 on the basis of the partition line pattern 112a'.

Figure 5B:
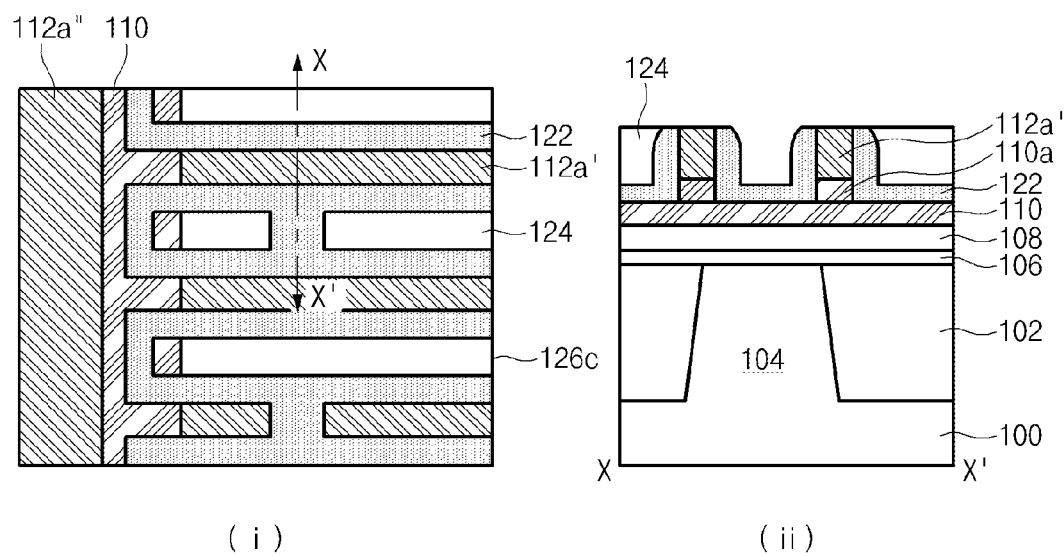
Figure 5C:
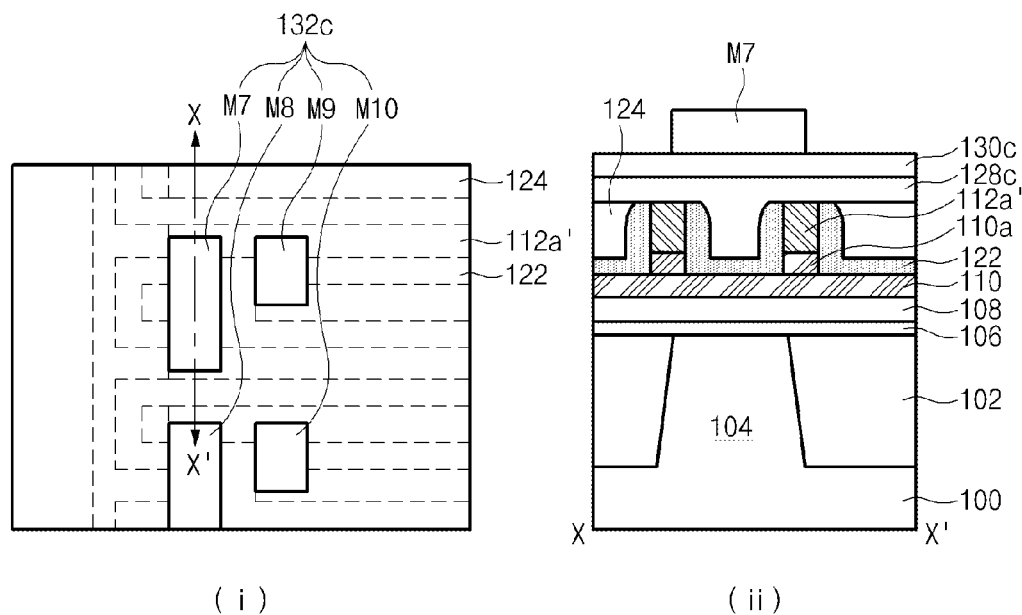
Figure 5D:
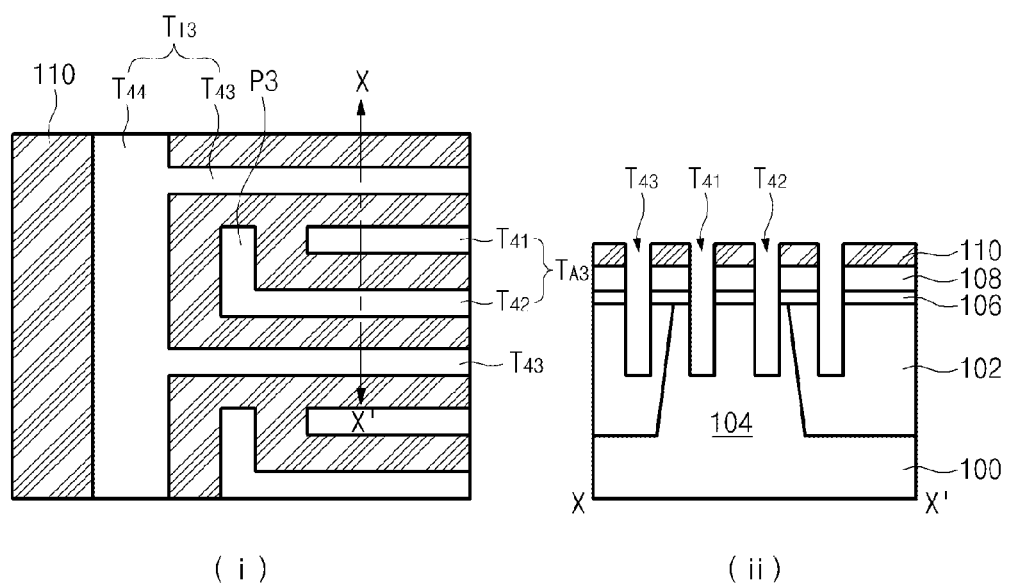

The first cutting mask pattern 126c is used as a mask connected to one side of the isolation gate trench ($T_{f3}$, See FIG. 5D). The first hole pattern H1 and the second hole pattern H2 may define a second cutting mask pattern 132c (See FIG. 5C) to be formed in a subsequent process and a pad part P3 (See FIG. 5D) of a trench of a gate used for cell operation.

Referring to FIG. 5B, the partition pattern 112a and the gap-filling layer 124 are removed using the first cutting mask pattern 126c as a mask. In this case, the partition pattern 112a or the gap-filling layer 124 has an etch selection ratio different from that of the spacer insulation layer 122. This allows the spacer insulation layer 122 to remain while the partition pattern 112a and the gap-filling layer 124 are removed using the first cutting mask pattern 126c as a mask. The partition pattern 112a and the gap-filling layer 124 may be dry-etched. Thereafter, the first cutting mask pattern 126c may be removed by stripping.

Referring to FIG. 5C, an SOC film 128c and a hard mask layer 130c are formed on the insulation film 110, the partition pattern 112a, the spacer insulation layer 122 and the gap-filling layer 124. Subsequently, a second cutting mask pattern 132c is formed to include a first pattern M7, a second pattern M8, a third pattern M9 and a fourth pattern M10. The first pattern M7 is disposed between a first region (the first region exposed by removal of a connecting part between the partition line pattern 112a' and the partition pad pattern 112a" by the first cutting mask pattern 126c) and a second region (the second region exposed by the first hole pattern H1 of the first cutting mask pattern 126c) and covers the gap-filling layer 124 and the spacer insulation layer 122 neighboring with the gap-filling layer 124. The second pattern M8 is disposed between regions exposed by the second hole pattern H2 of the first cutting mask pattern 126c, and covers the partition line pattern 112a' and the spacer insulation layer 122 neighboring the partition line pattern 112a'. The third pattern M9 and the fourth pattern M10 may neighbor the region exposed by the first hole pattern H1 of the first cutting mask pattern 126c, and may cover the spacer insulation layer 122, the partition line pattern 112a' and the gap-filling layer 124 neighboring the spacer insulation layer 122.

In this case, the third pattern M9 and the fourth pattern M10 may define one end of a trench ($T_{A3}$, See FIG. 5D) for an actual cell gate, the first pattern M7 and the third pattern M9 may define the pad part P3 (See FIG. 5D), and the second pattern M8 and the fourth pattern M10 may also define the pad part P3 (See FIG. 5D).

Referring to FIG. 5D, the hard mask layer 130b and the SOC film 128b are etched using the second cutting mask pattern 132c as a mask. Subsequently, the spacer insulation layer 122 is removed using an etch selection ratio between the partition pattern 112a and the spacer insulation layer 122. Subsequently, after the insulation film 110, the pad nitride film 108, and the pad oxide film 106 are etched (using the partition pattern 112a, the insulation pattern 110a, the gap-filling layer 124, and the spacer insulation layer 122 as a mask), the device isolation film 102 and the active region 104 are etched, so that the trenches $T_{A3}$ and $T_{J3}$ and the pad part P3 are formed.

The trench $T_{A3}$ may include a first trench T41 of a line type and a second trench T42 disposed in parallel to the first trench T41 simultaneously while being spaced apart from the first trench T41. The second trench T42 may be longer than the first trench T41. In addition, the trench $T_{J3}$ may include a third trench T43 and a fourth trench T44. The third trench T43 is disposed parallel to the first and second trenches T41 and T42 and is spaced apart from the first and second trenches T41 and T42. The fourth trench T44 is connected to the end of the third trench T43, and is located perpendicular to the third trench T43.

The pad part P3 may be connected to one side of the second trench T42 and may be extended in the direction of the first trench T41 parallel to the fourth trench T44. The pad part P3 may also be spaced apart from the third trench T43. After that, the partition pattern 112a, the insulation pattern 110a, the gap-filling layer 124, and the space insulation layer 122 are removed.

As apparent from the above description, the embodiments of the present invention provide methods for forming a semiconductor device using a negative spacer patterning method in such a manner that the semiconductor device includes a trench for a buried active cell gate and a pad part formed at the end of the trench of a buried active cell gate capable of operating a cell, so that a highly integrated semiconductor device can be easily formed.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming a semiconductor device comprising:
   forming a partition line pattern and a partition pad pattern connected to an end part of the partition line pattern over the semiconductor substrate;
   forming spacer insulation layers at sidewalls of the partition line pattern and the partition pad pattern;
   forming a gap-filling layer between the spacer insulation layers;
   forming a first cutting mask pattern to expose a connecting part between the partition line pattern and the partition pad pattern;
   removing the partition line pattern and the gap-filling layer adjacent to the spacer insulation layer using the first cutting mask pattern as a mask;
   forming a second cutting mask pattern including a first pattern and a second pattern, wherein the first pattern adjacent to a region exposed by the first cutting mask pattern and covers the gap-filling layer, the spacer insulation layer adjacent to the gap-filling layer, and some parts of the partition line pattern adjacent to the spacer insulation layer, and the second pattern covers the partition line pattern, the spacer insulation layer adjacent to the partition line pattern, and some parts of a gap-filling layer adjacent to the spacer insulation layer; and
   removing the spacer insulation layer using the second cutting mask pattern as a mask to form a gate trench in the substrate.

2. The method according to claim 1, further comprising:
   forming an insulation film over the semiconductor substrate.

3. The method according to claim 1, wherein the removing of the partition line pattern and the gap-filling layer adjacent to the spacer insulation layer using the first cutting mask pattern as a mask does not remove the spacer insulation layer using the spacer insulation layer and an etch selection ratio between the partition line pattern and the gap-filling layer.

4. The method according to claim 1, wherein each of the first pattern and the second pattern is an island pattern.

5. The method according to claim 1, further comprising:
   forming a trench by etching the semiconductor substrate using the residual partition line pattern, the partition pad pattern, and the gap-filling layer as a mask.

6. The method according to claim 2, wherein in the forming of the partition line pattern and the partition pad pattern, an upper part of the insulation film is partially etched so that an insulation pattern is formed.

7. The method according to claim 5, wherein the trench includes:
   a first trench of a line type;
   a second trench disposed in parallel to the first trench and spaced apart from the first trench;
   a third trench disposed in parallel to the first trench and the second trench and spaced apart from the first and the second trenches; and
   a fourth trench connected to the third trench and arranged in perpendicular to the third trench.

8. A method for forming a semiconductor device comprising:
   forming a partition line pattern over a semiconductor substrate, and forming a partition pad pattern connected to an end part of the partition line pattern;

forming spacer insulation layers at sidewalls of the partition line pattern and the partition pad pattern;
forming a gap-filling layer to be buried between the spacer insulation layers;
forming a first cutting mask pattern including a first concave part and a second concave part, wherein the first concave part exposes a connecting part between the partition line pattern and the partition pad pattern and also exposes the spacer insulation layer and the gap-filling layer and the partition line pattern adjacent to the spacer insulation layer, and wherein the second concave part is spaced apart from the first concave part by the spacer insulation layer adjacent to the gap-filling layer;
removing the partition line pattern and the gap-filling layer adjacent to the spacer insulation layer using the first cutting mask pattern as a mask;
forming a second cutting mask pattern including a first pattern and a second pattern that cover some parts of a region exposed by the first concave and the second concave parts, wherein the first pattern and the second pattern are spaced apart from uneven parts of the first concave part and the second concave part; and
removing the spacer insulation layer using the second cutting mask pattern as a mask.

9. The method according to claim 8, further comprising:
forming an insulation film over the semiconductor substrate.

10. The method according to claim 8, wherein the removing the partition line pattern and the gap-filling layer adjacent to the spacer insulation layer using the first cutting mask pattern as a mask does not remove the spacer insulation layer using an etch selection ratio between the partition line pattern and the gap-filling layer.

11. The method according to claim 8, further comprising:
forming a trench by etching the semiconductor substrate using the residual partition line pattern, the partition pad pattern, and the gap-filling layer as a mask.

12. The method according to claim 9, wherein, in the forming of the partition line pattern and the partition pad pattern, an upper part of the insulation film is partially etched so that an insulation pattern is formed.

13. The method according to claim 11, wherein the trench includes:
a first trench of a line type;
a second trench which is spaced apart from the first trench, is disposed in parallel to the first trench, and is shorter than the first trench;
a third trench disposed in parallel to the first trench and the second trench and spaced apart from the first and second trenches;
a fourth trench connected to an end part of the third trench and arranged in perpendicular to the third trench; and
a pad part which is extended in a direction parallel to the fourth trench, is connected to an end part of the second trench, and is spaced apart from the first trench and the third trench.

14. A method for forming a semiconductor device comprising:
forming a partition line pattern over a semiconductor substrate, and forming a partition pad pattern connected to an end part of the partition line pattern;
forming insulation layers at sidewalls of the partition line pattern and the partition pad pattern;
forming a gap-filling layer to be buried between the spacer insulation layers;
forming a first cutting mask pattern including a first concave part and a second concave part, wherein the first concave part exposes a connecting part between the partition line pattern and the partition pad pattern and also exposes the spacer insulation layer on the basis of the gap-filling layer, and the second concave part is spaced apart from the first concave part by the partition line pattern and the gap-filling layer adjacent to the spacer insulation layer and exposes the spacer insulation layer adjacent to the partition line pattern;
removing the partition line pattern and the gap-filling layer adjacent to the spacer insulation layer using the first cutting mask pattern as a mask;
forming a second cutting mask pattern to include first and second patterns and third and fourth patterns, wherein the first and second patterns cover some parts of a region exposed by the first concave and second concave parts of the first cutting mask pattern, and the third and fourth patterns are connected to some parts of a region exposed by the first concave and second concave parts of the first cutting mask pattern and cover a partition pattern and a gap-filling layer formed at both sides of the spacer insulation layer; and
removing the spacer insulation layer using the second cutting mask pattern as a mask.

15. The method according to claim 14, further comprising:
forming an insulation film over the semiconductor substrate.

16. The method according to claim 14, wherein each of the first pattern, the second pattern, the third pattern, and the fourth pattern is formed as an island.

17. The method according to claim 14, wherein the removing the partition line pattern and the gap-filling layer adjacent to the spacer insulation layer using the first cutting mask pattern as a mask does not remove the spacer insulation layer using the spacer insulation layer and an etch selection ratio between the partition line pattern and the gap-filling layer.

18. The method according to claim 14, further comprising:
after removing the spacer insulation layer, forming a trench by etching the semiconductor substrate using the residual partition line pattern, the partition pad pattern, and the gap-filling layer as a mask.

19. The method according to claim 15, wherein, in the forming of the partition line pattern and the partition pad pattern, an upper part of the insulation film is partially etched so that an insulation pattern is formed.

20. The method according to claim 18, wherein the trench includes:
a first trench of a line type;
a second trench which is spaced apart from the first trench, is disposed in parallel to the first trench, and is longer than the first trench;
a third trench disposed in parallel to the first trench and the second trench and spaced apart from the first and second trenches;
a fourth trench connected to an end part of the third trench and arranged in perpendicular to the third trench; and
a pad part which is extended in a direction parallel to the fourth trench, is connected to an end part of the second trench, and is spaced apart from the first trench and the third trench.

21. A method for forming a semiconductor device comprising:
forming a partition line pattern over a semiconductor substrate, and forming a partition pad pattern connected to an end part of the partition line pattern;
forming spacer insulation layers at sidewalls of the partition line pattern and the partition pad pattern;

forming a gap-filling layer to be buried between the spacer insulation layers;

forming a first cutting mask pattern including a first hole pattern and a second hole pattern, wherein the first hole pattern exposes a connecting part between the partition line pattern and the partition pad pattern and also exposes the spacer insulation layer on the basis of the gap-filling layer, and the second hole pattern is spaced apart from the first hole pattern by the partition line pattern and the gap-filling layer neighboring with the spacer insulation layer and exposes the spacer insulation layer neighboring with the partition line pattern;

removing the partition line pattern and the gap-filling layer neighboring with the spacer insulation layer using the first cutting mask pattern as a mask;

forming a second cutting mask pattern including a first pattern, a second pattern, a third pattern and a fourth pattern, wherein the first pattern is disposed between a region, that is exposed by removal of a connecting part between the partition line pattern and the partition pad pattern by the first cutting mask pattern, and a region exposed by the first hole pattern, and covers a gap-filling layer and a spacer insulation layer neighboring with the gap-filling layer; the second pattern is disposed between a region, that is exposed by removal of a connecting part between the partition line pattern and the partition pad pattern by the first cutting mask pattern, and a region exposed by the second hole pattern, and covers a partition line pattern and a spacer insulation layer neighboring with the partition line pattern; and the third and fourth patterns neighbor with the region exposed by the hole pattern and cover the spacer insulation layer and the partition line pattern and the gap-filling layer neighboring with the spacer insulation layer; and removing the spacer insulation layer using the second cutting mask pattern as a mask.

22. A method for forming a semiconductor device comprising:

providing a substrate including an active region and a device isolation region;

forming a first mask pattern in a line type over the substrate at a boundary of the active region and the device isolation region;

forming first and second spacer patterns at first and second sides of the first mask pattern, the first spacer pattern being located in the device isolation region, the second spacer pattern being located in the active region, the first spacer pattern and the second spacer pattern extending toward each other at a first end of the first mask pattern;

forming a first pad pattern at the first end of the first mask pattern; and removing the first and the second spacer patterns to form a first gate trench in the device isolation region and a second gate trench in the active region, the first gate trench extending to the first pad pattern and the second gate trench isolated from the first pad pattern.

23. The method of claim 22, wherein the step of forming the first pad pattern is performed using a second mask pattern exposing the first end of the first mask pattern.

24. The method of claim 22, wherein the step of removing the first and the second spacer pattern is performed using a third mask pattern exposing the first spacer pattern and blocking the second spacer pattern.

25. The method of claim 22, further comprising:

forming a second pad trench at an end of the second gate trench, the second pad trench extending from the second gate trench.

* * * * *